(12) United States Patent
Kawase

(10) Patent No.: US 10,497,570 B2
(45) Date of Patent: Dec. 3, 2019

(54) METHOD FOR MANUFACTURING SEMICONDUCTOR DEVICE HAVING BUFFER LAYER

(71) Applicant: Mitsubishi Electric Corporation, Tokyo (JP)

(72) Inventor: Yusuke Kawase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/552,575

(22) PCT Filed: Jun. 16, 2015

(86) PCT No.: PCT/JP2015/067305
§ 371 (c)(1),
(2) Date: Aug. 22, 2017

(87) PCT Pub. No.: WO2016/203546
PCT Pub. Date: Dec. 22, 2016

(65) Prior Publication Data
US 2018/0053655 A1 Feb. 22, 2018

(51) Int. Cl.
*H01L 21/265* (2006.01)
*H01L 29/78* (2006.01)
(Continued)

(52) U.S. Cl.
CPC ...... *H01L 21/26513* (2013.01); *H01L 21/268* (2013.01); *H01L 21/26506* (2013.01);
(Continued)

(58) Field of Classification Search
CPC ............. H01L 21/265; H01L 21/26506; H01L 21/26513; H01L 21/26586; H01L 21/324;
(Continued)

(56) References Cited

U.S. PATENT DOCUMENTS 5,147,811 A 9/1992 Sakagami
6,482,681 B1 11/2002 Francis et al.
(Continued)

FOREIGN PATENT DOCUMENTS

JP 05-129217 A 5/1993
JP 05-166745 A 7/1993
(Continued)

OTHER PUBLICATIONS

Notification of Transmittal of Translation of the International Preliminary Report on Patentability (Chapter I) and Translation of Written Opinion of the International Searching Authority; PCT/JP2015/067305; dated Dec. 28, 2017.
(Continued)

*Primary Examiner* — Shahed Ahmed
(74) *Attorney, Agent, or Firm* — Studebaker & Brackett PC

(57) ABSTRACT

A method for manufacturing a semiconductor device includes the steps of forming a layer of a second conductivity type on a top-surface side of a substrate of a first conductivity type, and forming a buffer layer by performing a plurality of ion implantation steps, each of the ion implantation steps implanting ions of an impurity of the first conductivity type into a bottom-surface side of the substrate with an ion implantation angle with respect to a bottom surface of the substrate fixed, the ion implantation angle of a subsequent one of the ion implantation steps being smaller than that of the previous ion implantation step, wherein in the buffer layer formation step, the plurality of ion implantation steps is performed at a fixed acceleration energy.

9 Claims, 7 Drawing Sheets

(51) Int. Cl.
  *H01L 21/324* (2006.01)
  *H01L 29/08* (2006.01)
  *H01L 29/66* (2006.01)
  *H01L 29/739* (2006.01)
  *H01L 29/32* (2006.01)
  *H01L 21/268* (2006.01)

(52) U.S. Cl.
  CPC ...... *H01L 21/26586* (2013.01); *H01L 21/324* (2013.01); *H01L 29/0821* (2013.01); *H01L 29/32* (2013.01); *H01L 29/66333* (2013.01); *H01L 29/7395* (2013.01); *H01L 29/78* (2013.01); *H01L 29/66348* (2013.01); *H01L 29/7397* (2013.01)

(58) Field of Classification Search
  CPC ........... H01L 29/0821; H01L 29/66333; H01L 29/739; H01L 29/7395; H01L 29/78; H01L 29/66325; H01L 29/7397; H01L 29/66803; H01L 21/046–047; H01L 21/3115–31155
  See application file for complete search history.

(56) References Cited

U.S. PATENT DOCUMENTS

| | | | |
|---|---|---|---|
| 2004/0043572 A1* | 3/2004 | Nishio | H01L 21/26513 438/302 |
| 2008/0315364 A1 | 12/2008 | Nemoto | |
| 2014/0246750 A1 | 9/2014 | Takishita et al. | |
| 2014/0374793 A1* | 12/2014 | Miyazaki | H01L 21/265 257/139 |
| 2015/0179441 A1 | 6/2015 | Onozawa | |
| 2016/0372541 A1* | 12/2016 | Onozawa | H01L 29/0619 |
| 2017/0047408 A1* | 2/2017 | Kuribayashi | H01L 21/265 |
| 2018/0108765 A1* | 4/2018 | Miyazaki | H01L 29/36 |

FOREIGN PATENT DOCUMENTS

| | | |
|---|---|---|
| JP | 2558961 B2 | 11/1996 |
| JP | 2000-164525 A | 6/2000 |
| JP | 2003-533047 A | 11/2003 |
| JP | 2007-266233 A | 10/2007 |
| JP | 2009-070886 A | 4/2009 |
| JP | 2012-238904 A | 12/2012 |
| WO | 01/86712 A1 | 11/2001 |
| WO | 2013/089256 A1 | 6/2013 |
| WO | 2014/065080 A1 | 5/2014 |

OTHER PUBLICATIONS

International Search Report issued in PCT/JP2015/067305; dated Aug. 25, 2015.

An Office Action; "Notification of Reasons for Refusal," issued by the Japanese Patent Office dated Sep. 4, 2018, which corresponds to Japanese Patent Application No. 2017-524179 and is related to U.S. Appl. No. 15/552,575; with English language translation.

An Office Action; "Notification of Reasons for Refusal," issued by the Japanese Patent Office dated May 8, 2018, which corresponds to Japanese Patent Application No. 2017-524179 and is related to U.S. Appl. No. 5/552,575; with English language translation.

An Office Action; "Trial and Appeal Decision," issued by the Japanese Patent Office dated Aug. 20, 2019, which corresponds to Japanese Patent Application No. 2017-524179 and is related to U.S. Appl. No. 15/552,575; with English language translation.

* cited by examiner

METHOD FOR MANUFACTURING SEMICONDUCTOR DEVICE HAVING BUFFER LAYER

FIELD

This invention relates to a method for manufacturing a semiconductor device for use in, for example, the control of a large current.

BACKGROUND

Currently, power discrete semiconductor devices such as punch-through IGBTs (Insulated Gate Bipolar Transistors) may use inexpensive single-crystal silicon substrates manufactured by the FZ (Floating Zone) method, the MCZ (Magnetic field applied Czochralski) method, and the like to reduce cost.

A method for manufacturing a punch-through IGBT using an N-type single-crystal silicon substrate will be briefly described. First, an N+ diffusion layer (emitter layer), a P+ diffusion layer (base layer), a gate insulating film, a gate electrode, a metal interconnection (emitter electrode), and the like are formed on the top-surface side of a substrate. Then, the substrate is ground from the bottom-surface side thereof until the thickness of the substrate becomes, for example, 100 μm. Thereafter, an impurity is introduced into the substrate from the bottom surface of the substrate by ion implantation, and the impurity is activated by an electric oven, laser annealing, or the like, thus forming an N+ buffer layer and a P+ collector layer on the bottom-surface side of the substrate.

In conventional techniques, an N+ buffer layer is formed by implanting ions of, for example, phosphorus at an energy of approximately 500 keV to 8 MeV. Accordingly, the position at which the impurity concentration has a local maximum value is at a depth of approximately 5 μm at most from the bottom surface of the substrate.

Moreover, a P+ collector layer is formed by implanting ions of, for example, boron at a low energy of approximately 5 to 100 keV. Accordingly, the impurity (boron) is located at a depth of approximately 0.1 to 1.0 μm from the bottom surface of the substrate.

Generally, in a semiconductor device having an impurity distribution on the bottom-surface side of the substrate, it is desirable that the semiconductor substrate should be thinned to reduce a loss. The reduction of a loss achieved by thinning the substrate is a tradeoff against deteriorations in breakdown voltage characteristics and oscillations caused by a surge voltage increase during turn-off operation.

Patent literature 1 discloses a technique that forms an N+ buffer layer (field stop layer) by performing a plurality of cycles of proton irradiation. If disorder (near-amorphous state with a high crystal defect density) is formed in the substrate by proton irradiation, a leakage current may increase, or a loss caused by a carrier mobility reduction may increase. Accordingly, the invention of Patent literature 1 performs a plurality of cycles of proton irradiation. Specifically, a subsequent cycle of proton irradiation is targeted at the position of disorder remaining after the previous cycle of proton irradiation.

Patent literature 2 discloses a technique that forms an N+ buffer layer having a broad distribution by introducing oxygen into a semiconductor substrate and then performing proton irradiation.

PRIOR ART

Patent Literature

Patent Literature 1: International Publication WO2013/089256

Patent Literature 2: Japanese Patent Laid-Open No. 2007-266233

SUMMARY

Technical Problem

It is preferable that a thick buffer layer be formed while disorder is reduced. However, the technique disclosed in Patent literature 1 performs a subsequent cycle of proton irradiation after changing the acceleration energy of the previous cycle of proton irradiation, and therefore has a problem that a long period of time is required for beam adjustment and thus, the manufacture efficiency is decreased. Moreover, the technique disclosed in Patent literature 2 performs proton irradiation after introducing oxygen, and therefore causes an increase in the number of manufacturing steps and a problem that the distribution of the N+ buffer layer cannot be accurately controlled.

The present invention has been accomplished to solve the above-described problems, and an object of the present invention is to provide a semiconductor device manufacturing method which can form a thick buffer layer with less disorder while efficiently reducing variations.

Means for Solving the Problems

According to a present invention, a method for manufacturing a semiconductor device, includes the steps of forming a layer of a second conductivity type on a top-surface side of a substrate of a first conductivity type, and forming a buffer layer by performing a plurality of ion implantation steps, each of the ion implantation steps implanting ions of an impurity of the first conductivity type into a bottom-surface side of the substrate with an ion implantation angle with respect to a bottom surface of the substrate fixed, the ion implantation angle of a subsequent one of the ion implantation steps being smaller than that of the previous ion implantation step, wherein in the buffer layer formation step, the plurality of ion implantation steps is performed at a fixed acceleration energy.

Other features of the present invention will become apparent from the following description.

Advantageous Effects of Invention

In accordance with this invention, at a plurality of ion implantation steps having different ion implantation angles and the same acceleration energy implant, an impurity is injected in order from a deeper position of the substrate. Accordingly, a thick buffer layer with less disorder can be formed while variations are efficiently reduced.

DESCRIPTION OF THE EMBODIMENTS

Semiconductor device manufacturing methods according to embodiments of the present invention will be described with reference to the drawings. The same or corresponding components will be denoted by the same reference signs, and the repetition of explanation thereof may be omitted.

Embodiment 1

Figure 1:
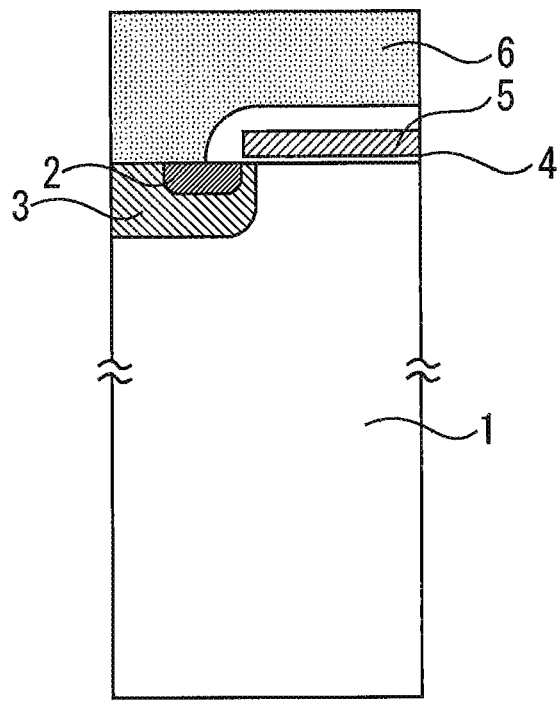
FIG. 1 is a cross-sectional view of a semiconductor device showing a state in which the structures on the top-surface side of the substrate have been formed.

FIGS. 1 to 8 are views showing a semiconductor device manufacturing method according to Embodiment 1 of the present invention. In the semiconductor device manufacturing method according to Embodiment 1, first, structure on the top-surface side of a substrate is formed. FIG. 1 is a cross-sectional view of a semiconductor device in the course of manufacture, showing a state in which the structures on the top-surface side of the substrate have been formed. A substrate 1 is made of N-type single-crystal silicon. An emitter layer 2 which is made of an N+ diffusion layer, a base layer 3 which is made of P+ diffusion layer, a gate insulating film 4, a gate electrode 5, an emitter electrode 6 which is a metal interconnection, and the like are formed on the top-surface side of the substrate 1 by publicly-known methods. It should be noted that a passivation film may be formed on these structures.

Subsequently, the thickness of the substrate 1 is reduced to, for example, approximately 100 μm by grinding the substrate 1 from the bottom-surface side of the substrate 1. Preferably, protecting tape is attached to the top-surface side of the substrate 1 to protect the structures on the top-surface side of the substrate 1 during grinding. Generally, protecting tape has heat resistant to around 100° C., and the protecting tape needs to be removed before a step in which the temperature of the top-surface side of the substrate having protecting tape becomes 100° C. or more.

Figure 2:
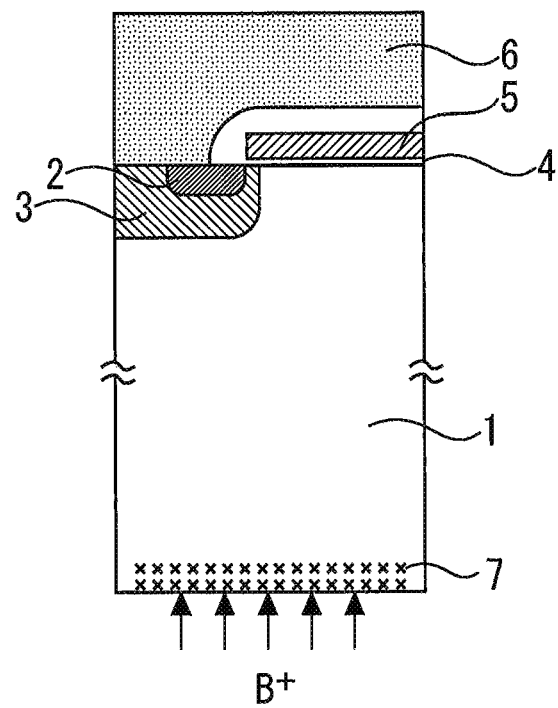
FIG. 2 is a view showing a boron implantation.

Subsequently, ions of a P-type impurity which forms a collector layer are implanted. FIG. 2 is a cross-sectional view showing a state in which a P-type impurity that forms a P+ collector layer has been implanted. Using an intermediate-current ion implanter, a P-type impurity (boron 7) is implanted into the bottom-surface side of the substrate 1. The implantation energy of boron is set to a low energy of, for example, 100 keV or less, and thus the boron 7 is implanted into a shallow region from the bottom surface of the substrate 1.

Subsequently, activation annealing is performed on the substrate 1 by a laser annealing apparatus or an electric oven to activate the implanted impurity. Thus, the aforementioned boron 7 is activated, and a collector layer is formed.

Figure 3:
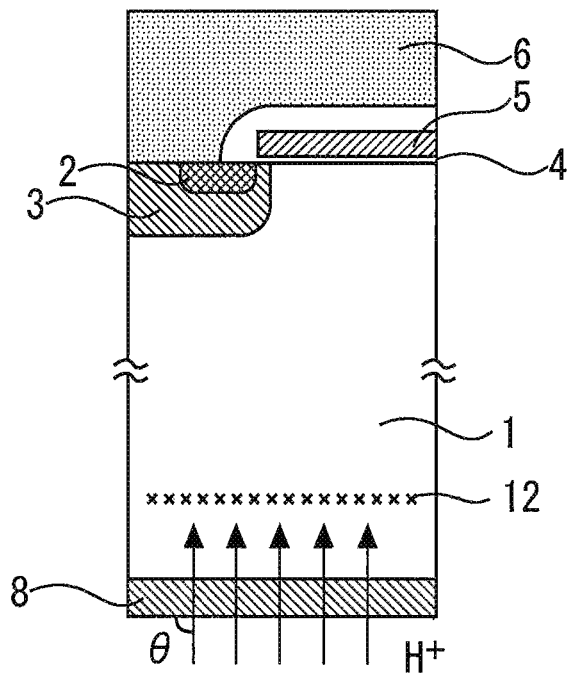
FIG. 3 is a view showing processing performed in the first ion implantation step.

Subsequently, a first ion implantation step is performed. FIG. 3 is a view showing processing performed in the first ion implantation step. In the first ion implantation step, for example, using a high-energy ion implanter, an impurity (protons 12) is implanted from the bottom-surface side of the substrate 1. At this time, the acceleration energy is fixed. Moreover, the ion implantation angle θ with respect to the bottom surface of the substrate 1 is 90° to 83°. In other words, ions are implanted at an angle of approximately 0° to 7° when the direction perpendicular to the bottom surface of the substrate 1 is regarded as 0°. The first ion implantation step is a step in which the protons 12 are implanted into the entire bottom surface of the substrate 1 with the acceleration energy and the ion implantation angle fixed.

Figure 4:
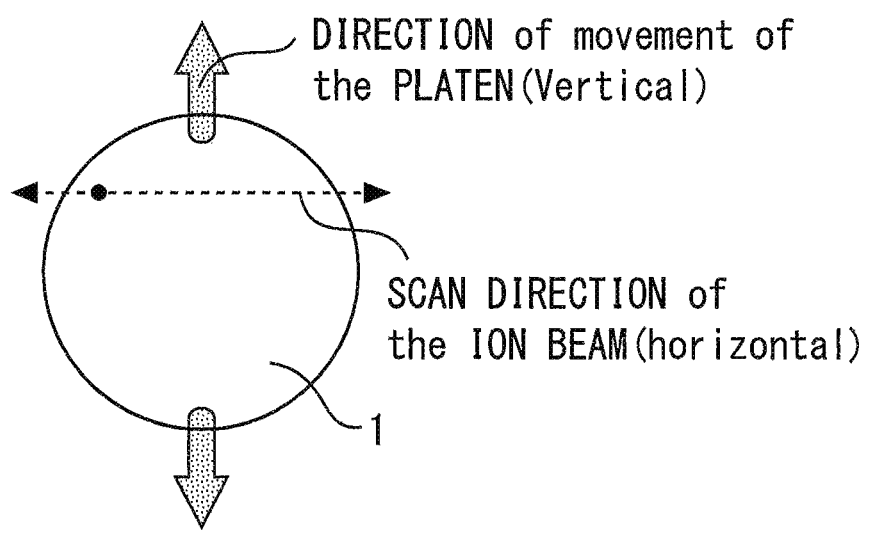
FIG. 4 is a view showing a scan direction of the ion beam and a direction of movement of the platen.

In the first ion implantation step, to ensure the uniformity of the amount of the implanted impurity across the substrate surface, an ion beam or a platen holding the substrate 1 is moved vertically and horizontally. Alternatively, while the ion beam is being scanned horizontally, the platen is moved vertically, thus implanting ions into the entire bottom surface of the substrate 1. FIG. 4 is a view showing a state in which while the ion beam is being scanned horizontally, the platen is being scanned vertically. To ensure the uniformity of the implanted impurity across the substrate surface, it is preferable that a lower limit be set for the number of times of scanning the ion beam or the platen.

If the ion implantation angle is changed during the first ion implantation step, uniformity across the substrate surface degrades, and the implantation depth cannot be controlled. Accordingly, the ion implantation angle is fixed in the first ion implantation step.

Figure 5:
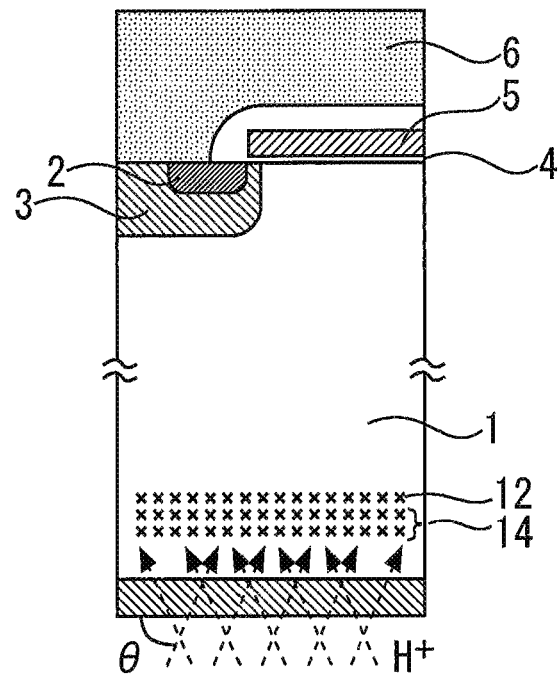
FIG. 5 is a view showing processing performed in the second ion implantation step.

Subsequently, a second ion implantation step is performed. FIG. 5 is a view showing processing performed in the second ion implantation step. In the second ion implantation step, for example, using a high-energy ion implanter, an impurity (protons 14) is implanted from the bottom-surface side of the substrate 1. The acceleration energy is set to the same acceleration energy as in the first ion implantation step. Moreover, the ion implantation angle θ with respect to the bottom surface of the substrate 1 is 50°. In other words, ions are implanted at an angle of approximately 40° when the direction perpendicular to the bottom surface of the substrate is regarded as 0°.

The ion implantation angle in the second ion implantation step is smaller than the ion implantation angle in the first ion implantation step. Accordingly, the protons 14 are located at positions shallower from the bottom surface of the substrate 1 than the positions of the protons 12.

Figure 6:
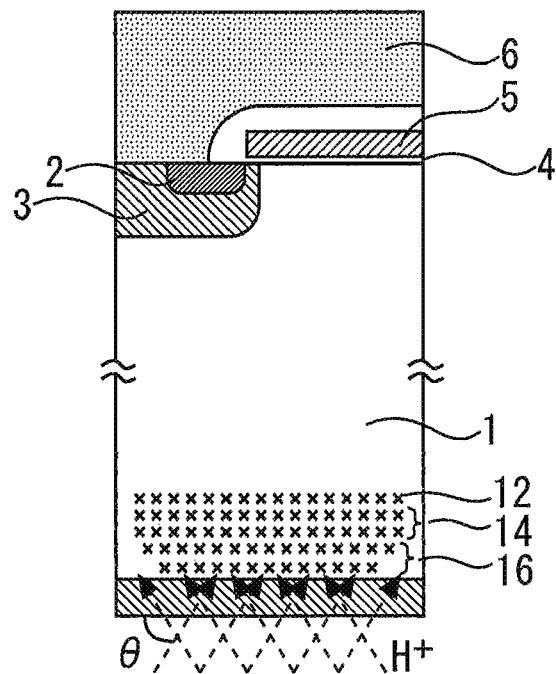
FIG. 6 is a view showing processing performed in the third ion implantation step.

Subsequently, a third ion implantation step is performed. FIG. 6 is a view showing processing performed in the third ion implantation step. In the third ion implantation step, for example, using a high-energy ion implanter, an impurity (protons 16) is implanted from the bottom-surface side of the substrate 1. The acceleration energy is set to the same acceleration energy as in the first ion implantation step. Moreover, the ion implantation angle θ with respect to the bottom surface of the substrate 1 is 30°. In other words, ions are implanted at an angle of approximately 60° when the direction perpendicular to the bottom surface of the substrate is regarded as 0°. It should be noted that in the second third ion implantation step, as in the first ion implantation step, at least one of the ion beam and the platen is moved to ensure the uniformity of the implanted impurity across the substrate surface.

The ion implantation angle in the third ion implantation step is smaller than the ion implantation angle in the second ion implantation step. Accordingly, the protons 16 are located at positions shallower from the bottom surface of the substrate 1 than the positions of the protons 14. The first to third ion implantation steps are collectively referred to as a buffer layer formation step.

Figure 7:
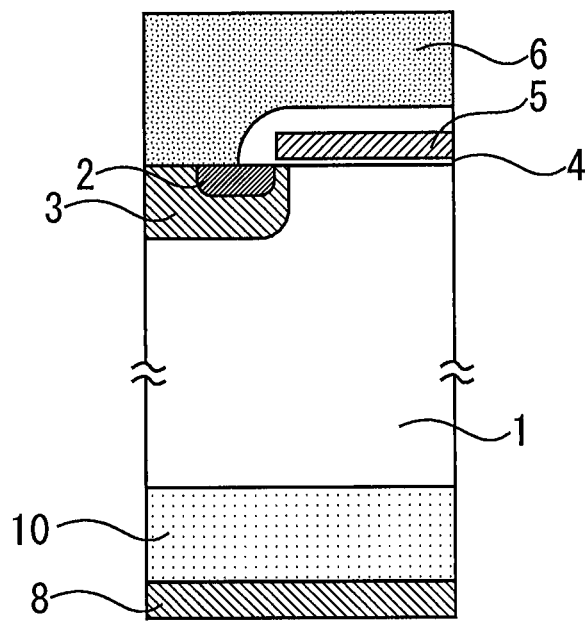
FIG. 7 is a cross-sectional view of the semiconductor device after the annealing step.

Subsequently, after the buffer layer formation step, an annealing step (activation annealing) is performed. In the annealing step, heat treatment at, for example, approximately 400° C. is performed on the substrate 1. FIG. 7 is a cross-sectional view of the semiconductor device after the annealing step. The annealing step forms a buffer layer 10 (field stop layer), which is an N+ region. The collector layer 8 has been formed by the annealing before the buffer layer formation step. However, the annealing for forming the collector layer 8 and the annealing for forming the buffer layer 10 may be merged into a single step. Specifically, the activation annealing performed to form the collector layer 8 before the buffer layer formation step may be omitted.

Figure 8:
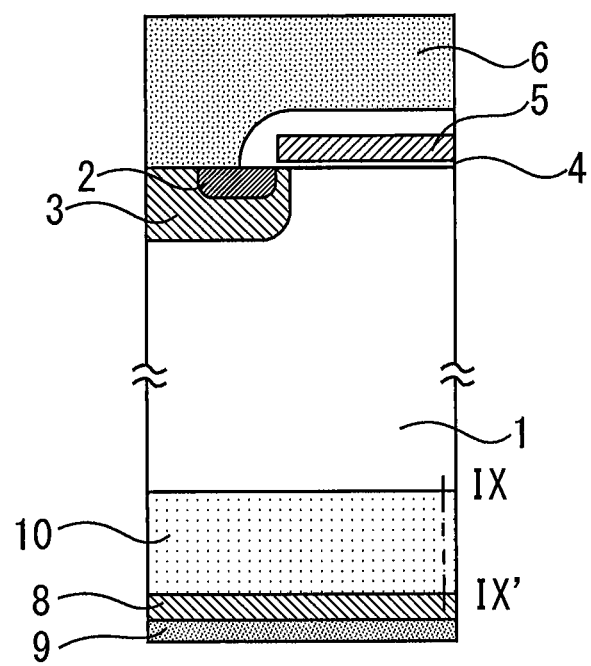
FIG. 8 is a cross-sectional view of the semiconductor device in which a collector electrode has been formed.

Finally, the bottom-surface side of the substrate 1 is cleaned, and then a collector electrode is formed. FIG. 8 is a cross-sectional view of the semiconductor device in which a collector electrode 9 contacting the collector layer 8 has been formed. The collector electrode 9 is formed by forming a metal film.

Figure 9:
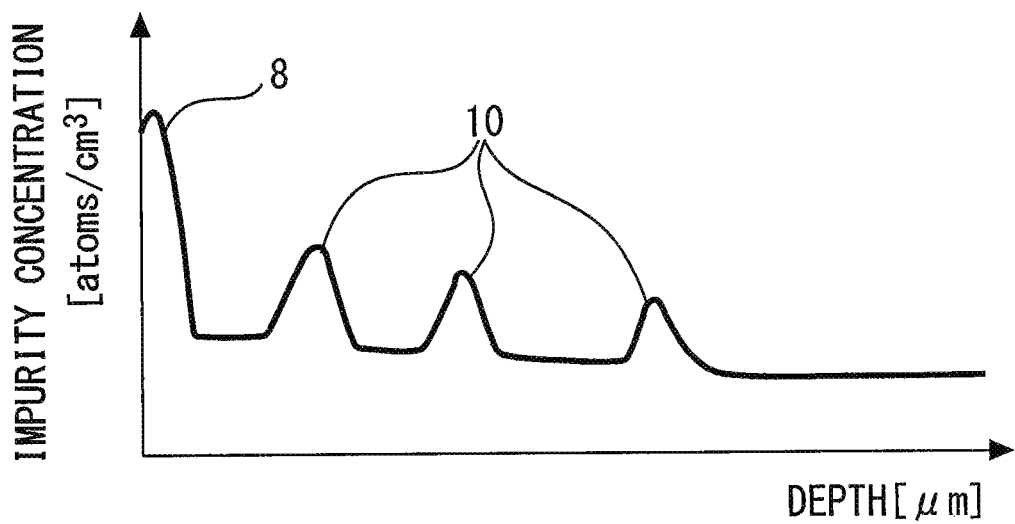
FIG. 9 is a graph showing the impurity distribution along line IX-IX' in FIG. 8.

FIG. 9 is a graph showing the impurity distribution of the collector layer 8 and the buffer layer 10 along line IX-IX' in FIG. 8. The buffer layer 10 is a layer which has three impurity concentration peaks and which is formed to a deep position of the substrate.

In the buffer layer formation step, a plurality of ion implantation steps of implanting n-type impurity ions into the bottom-surface side of the substrate 1 with the ion implantation angle with respect to the bottom surface of the substrate 1 fixed are performed such that the ion implantation angle in a subsequent ion implantation step becomes smaller than that of the previous ion implantation step. In other words, ions are implanted into deep positions of the substrate 1 first, and a later ion implantation step implants ions into shallower positions in the substrate 1. In the first ion implantation step in which the amount of disorder in the substrate is small, an impurity is implanted into a deep position in the substrate. Accordingly, the impurity can be made to reach a deep position in the substrate without interference by disorder. Accordingly, a thick buffer layer can be formed.

If the ion implantation step which causes an impurity to reach a deepest position of the substrate among the plurality of ion implantation steps is performed as the second or subsequent ion implantation step, disorder introduced by the previous ion implantation step reduces the ion range. Accordingly, the impurity cannot be implanted to an intended depth. To avoid this problem, in Embodiment 1, ions are implanted into deep positions in the substrate first, and a later ion implantation step implants ions into shallower positions in the substrate.

The semiconductor device manufacturing method according to Embodiment 1 of the present invention can form a thick (broad) buffer layer. By forming the thick buffer layer 10, the peak concentration of the buffer layer 10 can be reduced, and turn-off oscillations can be reduced. Moreover, since the impurity distribution along the depth of the substrate can be designed as desired, the substrate can be thinned to reduce a loss.

The turn-off operation of the semiconductor device will be briefly described. When the positive voltage on the gate electrode 5 is lowered in the turn-on state of the semiconductor device, a channel formed near the gate insulating film 4 disappears, and the injection of electrons from the emitter layer 2 to the substrate 1 stops. At this time, the potential on the buffer layer 10 increases, electric charges (holes) injected from the collector layer 8 into the substrate 1 decreases, and carriers (electrons, holes) accumulated in the substrate 1 disappear in pairs within the substrate 1. Alternatively, electrons in the substrate 1 flow toward the collector electrode 9 to be combined with holes and disappear, and holes in the substrate 1 flow from the base layer 3 to the emitter electrode 6 to be combined with electrons and disappear. When all carriers accumulated in the substrate 1 have disappeared, the substrate 1 is turned in a high-resistance off state.

In accordance with Embodiment 1 of the present invention, ions are implanted into deep positions in the substrate first, and a later ion implantation step implants ions into shallower positions in the substrate. Thus, subsequent proton implantation can supply (compensate) protons to a disorder region produced by the previous proton implantation. To enable this compensation, the ion implantation angle with respect to the bottom surface of the substrate is determined. The ion implantation angle is a parameter that determines the peak concentration depth of the impurity. Accordingly, in addition to the optimization of the ion implantation angle, by optimizing the amount of implantation so that a necessary amount of protons can be supplied to a depth at which disorder is formed, disorder can be reduced. By reducing problematic disorder by proton implantation, breakdown voltage characteristics can be improved, oscillations during turn-off operation can be reduced, and leakage current and loss can be reduced.

Thus, the semiconductor device manufacturing method according to Embodiment 1 of the present invention can form a thick buffer layer with less disorder.

In the case where the acceleration energy is changed after the previous ion implantation step and a subsequent ion implantation step is performed, a long period of time is required for beam adjustment, and manufacture efficiency is very low. However, in the semiconductor device manufacturing method according to Embodiment 1 of the present invention, the buffer layer formation step performs a plurality of ion implantation steps at a fixed acceleration energy. In other words, the acceleration energy is not changed in the buffer layer formation step. Accordingly, the semiconductor device can be efficiently manufactured.

Moreover, the semiconductor device manufacturing method according to Embodiment 1 of the present invention changes the ion implantation depth by changing the ion implantation angle with respect to the bottom surface of the substrate 1, and therefore does not require the oxygen introduction disclosed in Patent literature 2. Accordingly, an increase in the number of manufacturing steps and variations in the thickness of the buffer layer can be reduced.

Between previous and subsequent ion implantation steps, the acceleration energy is not changed, and only the ion implantation angle is changed. Thus, a plurality of ion implantation steps can be continuously performed.

The semiconductor device manufacturing method according to Embodiment 1 of the present invention can be variously modified. For example, in the buffer layer formation step, light ions such as helium ions may be implanted instead of protons. Implanting light ions makes it possible to introduce an impurity to a depth of approximately 30 µm from the bottom surface of the substrate. This improves breakdown voltage characteristics and reduces turn-off oscillations. Thus, the substrate can be thinned to reduce a loss. More than one ion implantation steps (cycles) need to be performed but the number thereof is not limited to three.

The conductivity types of layers manufactured by the semiconductor device manufacturing method according to Embodiment 1 may be inverted. Each layer is formed to be of any one of a first conductivity type (one of N type and P type) and a second conductivity type (the other of N type and P type).

In Embodiment 1 of the present invention, a planar IGBT is manufactured as a semiconductor device. However, the manufacturing method of the present invention can be broadly applied to power discrete semiconductors such as trench IGBTs and diodes. In the case where a diode is manufactured, first, an impurity which forms a P-type anode layer is implanted into the top-surface side of an N-type substrate. Subsequently, an impurity which forms an N+ cathode layer is implanted into the bottom-surface side of the substrate. Subsequently, ion implantation equivalent to that in the above-described buffer layer formation step is performed on the bottom-surface side of the substrate. Specifically, a plurality of ion implantation steps, each of the ion implantation steps implanting ions of an N-type impurity into the bottom-surface side of the substrate with the ion implantation angle with respect to the bottom surface of the substrate fixed, are performed such that the ion implantation angle of a subsequent ion implantation step is smaller than that of the previous ion implantation step. After that, by performing an annealing step, a thick buffer layer with less disorder can be formed between the substrate and the cathode layer.

The structures formed on the top-surface side of the substrate are an N+ type (first conductivity type) emitter layer 2, a P+ type (second conductivity type) base layer 3, and the like in the case of an IGBT, or a P-type (second conductivity type) anode layer in the case of a diode. In either case, a P-type (second conductivity type) layer is formed on the top-surface side of the N-type (first conductivity type) substrate.

In the case where the bottom surface of the substrate has irregularities, it is preferable that the substrate be rotated in the buffer layer formation step to prevent shadowing. In the case where ions are implanted perpendicular to the bottom surface of the substrate in the ion implantation step (first ion implantation step) performed first, the substrate is rotated in the second and subsequent ion implantation steps. The substrate may be constantly rotated in the buffer layer formation step, but the substrate may be periodically moved in a rotational direction. For example, a stepping method in which the substrate is periodically rotated by 45° may be employed. In the case where the substrate is periodically rotated, the platen can be controlled easier than in the case where the substrate is constantly rotated.

These modifications can also be applied to semiconductor device manufacturing methods according to embodiments below. The semiconductor device manufacturing methods according to the embodiments below have many things in common with the semiconductor device manufacturing method according to Embodiment 1, and therefore differences from Embodiment 1 will be mainly described.

Embodiment 2

Figure 10:
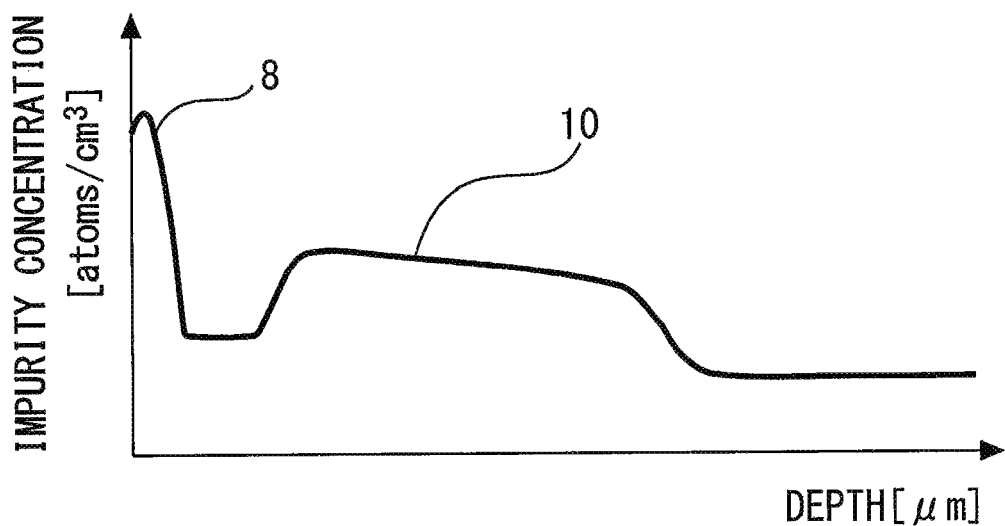
FIG. 10 is a graph showing the impurity distribution of the buffer layer according to Embodiment 2.

In Embodiment 2 of the present invention, as in Embodiment 1, the buffer layer formed by the buffer layer formation step is activated by an annealing step. The buffer layer after the annealing step has just one local maximum point of the impurity concentration along the depth. FIG. 10 is a graph showing the impurity distribution of the buffer layer 10 according to Embodiment 2. FIG. 10 shows the impurity concentration in which the depth from the bottom surface of the substrate increases from the left to the right. The maximum concentrations of the respective implantation steps are connected to form a broad distribution, and the buffer layer 10 has a smooth impurity profile. As a result, the impurity concentration of the buffer layer 10 has one local maximum point.

The impurity distribution of the buffer layer 10 shown in FIG. 10 can be realized by adjusting implantation amounts by performing, for example, four ion implantation steps. Specifically, the ion implantation angle of the first ion implantation step is set to 7°, the ion implantation angle of the second ion implantation step is set to 30°, the ion implantation angle of the third ion implantation step is set to 45°, the ion implantation angle of the fourth ion implantation step is set to 60°, and an annealing step is performed by heat treatment at approximately 400° C., thus realizing the impurity distribution in FIG. 10.

Making the buffer layer 10 have just one local maximum point of the impurity concentration along the depth means that any portion of the buffer layer has a relatively high impurity concentration. As a result, in the case where the sum of impurities of the buffer layer 10 in FIG. 9 and the sum of impurities of the buffer layer in FIG. 10 (the present embodiment) are equal, the peak concentration of the present embodiment can be made smaller. By making the peak concentration smaller, the function of facilitating the supply of electric charges (holes) during turn-off operation can be strengthened. Thus, oscillations can be reduced.

To ensure that the relatively thick buffer layer has just one local maximum point of the impurity concentration, it is important to increase the number of ion implantation steps. Typically, approximately four ion implantation steps are needed, but the number of ion implantation steps is not limited to four and can be set to a desired number.

Embodiment 3

Figure 11:
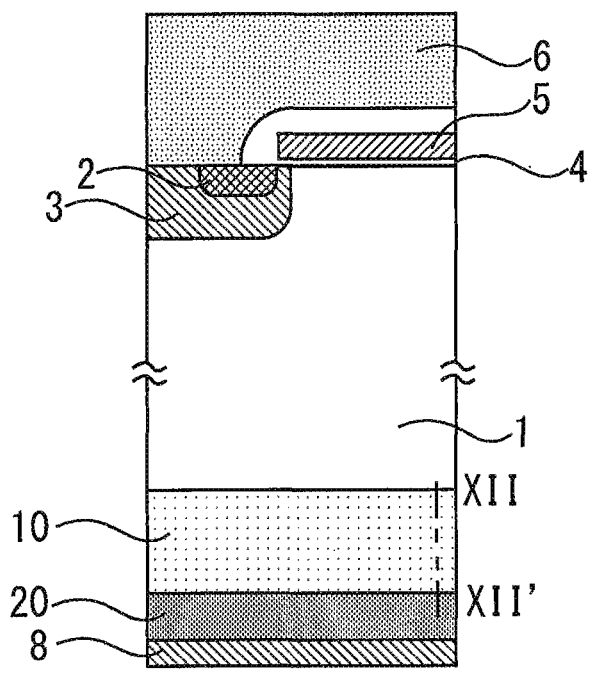
FIG. 11 is a cross-sectional view of a semiconductor device formed by a semiconductor device manufacturing method according to Embodiment 3.
Figure 12:
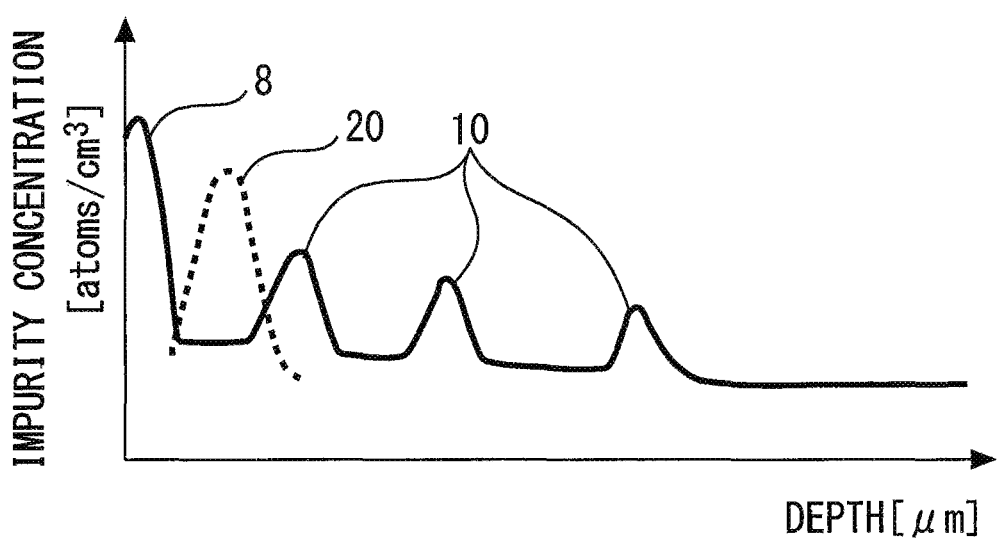
FIG. 12 is a graph showing the impurity distribution along line XII-XII' in FIG. 11.

FIG. 11 is a cross-sectional view of a semiconductor device formed by a semiconductor device manufacturing method according to Embodiment 3. An intermediate buffer layer 20 into which P is implanted is formed between the collector layer 8 and the buffer layer 10. FIG. 12 is a graph showing the impurity distribution along line XII-XII' in FIG. 11. The impurity concentration peak of the intermediate buffer layer 20 is higher than the impurity concentration peak of the buffer layer 10.

To manufacture the intermediate buffer layer 20, first, for example, phosphorus (P) is implanted from the bottom-surface side of the substrate 1 at an implantation energy of approximately 500 keV to 8 MeV. This step is referred to as an intermediate buffer layer formation step. After that, an annealing step is performed to activate P. The implantation of P ions may be performed before the buffer layer formation step or may be performed after the buffer layer formation step. Preferably, all of the ions implanted to form the buffer layer 10, the ions implanted to form the intermediate buffer layer 20, and the ions implanted to form the collector layer 8 are activated at a time by a single annealing step. In the annealing step, the substrate is heated to approximately 400° C.

After the annealing step, as shown in FIG. 12, the impurity concentration peak of the intermediate buffer layer 20 is located between the position of an impurity concentration peak of the buffer layer 10 and the position of the impurity concentration peak of the collector layer 8. A feature of the semiconductor device manufacturing method according to Embodiment 3 is that the intermediate buffer layer 20 having an impurity concentration peak higher than that of the buffer layer 10 is provided between the buffer layer 10 and the collector layer 8. This intermediate buffer layer 20 makes it possible to ensure breakdown voltage characteristics. Accordingly, the peak concentration and the impurity amount of the buffer layer 10 can be reduced, and oscillation reduction effect during turn-off operation can be improved.

Figure 13:
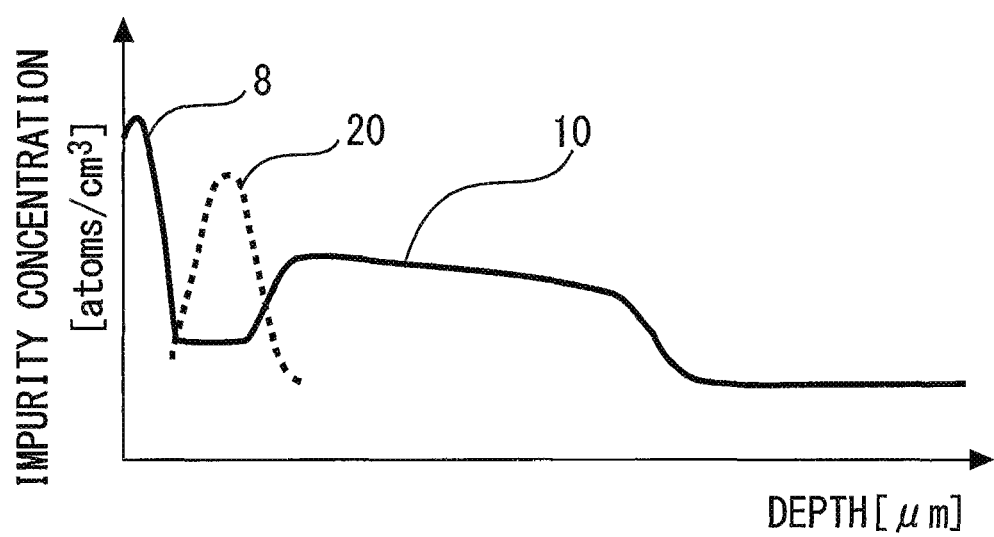
FIG. 13 is a view showing the impurity distribution of the semiconductor device according to the modification.

It should be noted that features of the semiconductor device manufacturing methods according to the above-described embodiments may be appropriately combined to improve advantageous effects of the present invention. For example, as shown in FIG. 13, the intermediate buffer layer 20 may be provided between the buffer layer 10 having one local maximum value and the collector layer 8.

DESCRIPTION OF SYMBOLS 1 substrate, 2 emitter layer, 3 base layer, 4 gate insulating film, 5 gate electrode, 6 emitter electrode, 7 boron, 8 collector layer, 9 collector electrode, 10 buffer layer, 12,14, 16 protons, 20 intermediate buffer layer.

The invention claimed is:

1. A method for manufacturing a semiconductor device comprising:
    forming a layer of a second conductivity type on a top-surface side of a substrate of a first conductivity type;
    forming a buffer layer by performing a plurality of ion implantations, each of the ion implantations implanting ions of an impurity of the first conductivity type into a bottom-surface side of the substrate with an ion implantation angle with respect to a bottom surface of the substrate fixed, the ion implantation angle of a subsequent one of the ion implantations being smaller than that of the previous ion implantation,
    forming a collector layer of the second conductivity type on the bottom-surface side of the substrate; and
    after forming the collector layer, performing annealing, wherein
    in forming the buffer layer, the plurality of ion implantations are performed at a fixed acceleration energy, and with ion implantation angle with respect to a bottom surface of the substrate fixed, the substrate is rotated while at least one ion implantation is performed, and
    the forming of the buffer layer is performed subsequent to performing the annealing.

2. The method according to claim 1, wherein in forming the buffer layer, the substrate is constantly rotated.

3. The method according to claim 1, wherein
    in a first one of the ion implantations, ions are implanted perpendicular to the bottom surface of the substrate, and
    in second and subsequent ones of the ion implantations, the substrate is rotated.

4. The method according to claim 1, wherein said rotation in forming the buffer layer is periodic.

5. The method according to claim 1, wherein in forming the buffer layer, protons or helium ions are implanted.

6. The method according to claim 1, further comprising:
    performing annealing after the buffer layer formation,
    wherein the annealing causes the buffer layer to have just one local maximum point of the impurity concentration along a depth thereof.

7. The method according to claim 1, further comprising:
    forming a collector electrode contacting the collector layer.

8. The method according to claim 7, further comprising:
    performing annealing after the buffer layer formation; and
    forming an intermediate buffer layer before the annealing by implanting P into the bottom surface of the substrate,
    wherein after the annealing, an impurity concentration peak of the intermediate buffer layer is located between a position of an impurity concentration peak of the buffer layer and a position of an impurity concentration peak of the collector layer, and
    the impurity concentration peak of the intermediate buffer layer is higher than the impurity concentration peak of the buffer layer.

9. The method according to claim 8, wherein the annealing causes the buffer layer to have just one local maximum point of the impurity concentration along a depth thereof.

* * * * *